(12) United States Patent
Sun et al.

(10) Patent No.: US 12,189,008 B1
(45) Date of Patent: Jan. 7, 2025

(54) ATOMIC BEAM MAGNETIC RESONANCE METHOD AND SYSTEM BASED ON COMBINED SEPARATED OSCILLATORY FIELDS

(71) Applicant: National Time Service Center, Chinese Academy of Sciences, Xi'an (CN)

(72) Inventors: Fuyu Sun, Xi'an (CN); Chao Li, Xi'an (CN); Shougang Zhang, Xi'an (CN)

(73) Assignee: National Time Service Center, Chinese Academy of Sciences, Xi'an (CN)

( * ) Notice: Subject to any disclaimer, the term of this patent is extended or adjusted under 35 U.S.C. 154(b) by 0 days.

(21) Appl. No.: 18/809,338

(22) Filed: Aug. 20, 2024

(30) Foreign Application Priority Data

Feb. 28, 2024 (CN) .......................... 202410221678.6

(51) Int. Cl.
*G01R 33/46* (2006.01)
*G04F 5/14* (2006.01)
*H03L 7/26* (2006.01)

(52) U.S. Cl.
CPC .......... *G01R 33/4625* (2013.01); *G04F 5/14* (2013.01); *H03L 7/26* (2013.01)

(58) Field of Classification Search
CPC .......... G01R 33/4625; G04F 5/14; H03L 7/26
See application file for complete search history.

(56) References Cited

U.S. PATENT DOCUMENTS

| 3,060,384 A | * | 10/1962 | McCoubrey | H05H 3/00 250/251 |
| 3,675,149 A | * | 7/1972 | Cutler | H03L 7/26 330/4 |

(Continued)

OTHER PUBLICATIONS

Ramsey, Norman F., et al., "Phase Shifts in the Molecular Beam Method of Separated Oscillating Fields" Physical Review Letters, vol. 84, No. 3, pp. 506-507 (Nov. 1, 1951) (Year: 1951).*

(Continued)

*Primary Examiner* — Steven L Yeninas

(57) ABSTRACT

Provided are an atomic beam magnetic resonance method and system based on combined separated oscillatory fields. The method includes: generating, by an atomic beam source, two identical atomic beams; performing atomic state purification treatment on the two identical atomic beams to generate two identical state-purified atomic beams; exciting, by zero-phase-difference SOFs, one identical state-purified atomic beam to perform atomic beam magnetic resonance to obtain a first atomic beam magnetic resonance signal; and exciting, by π-phase-difference SOFs, the other identical state-purified atomic beam to perform atomic beam magnetic resonance to thereby obtain a second atomic beam magnetic resonance signal, the zero-phase-difference SOFs and the π-phase-difference SOFs have the same interaction length, the same drift length, and the same oscillatory field strength; and performing subtraction operation on the first atomic beam magnetic resonance signal and the second atomic beam magnetic resonance signal to thereby generate a combined Ramsey magnetic resonance signal.

7 Claims, 3 Drawing Sheets

(56) References Cited

U.S. PATENT DOCUMENTS 4,146,848 A * 3/1979 Hellwig .................... H03L 7/26
                                                                         324/350
2014/0303931 A1* 10/2014 Suzuki ................... B82Y 10/00
                                                                         702/179

OTHER PUBLICATIONS

Ramsey, Norman F., "A Molecular Beam Resonance Method with Separated Oscillating Fields," Physical Review Letters, vol. 78, No. 6, pp. 695-699 (Jun. 15, 1950) (Year: 1950).*

* cited by examiner

ATOMIC BEAM MAGNETIC RESONANCE METHOD AND SYSTEM BASED ON COMBINED SEPARATED OSCILLATORY FIELDS

CROSS-REFERENCE TO RELATED APPLICATION

This application claims priority to a Chinese patent application No. 202410221678.6, filed to China National Intellectual Property Administration (CNIPA) on Feb. 28, 2024, which is herein incorporated by reference in its entirety.

TECHNICAL FIELD

The disclosure relates to the field of precision spectroscopy of atoms and molecules, particularly to an atomic beam magnetic resonance method and system based on combined separated oscillatory fields (SOFs).

BACKGROUND

The revolutionary progress in the field of precision spectroscopy of atoms and molecules originated from theoretical and experimental research by Stern, Rabi, Kastler, and Ramsey, who won Nobel Prizes in Physics in 1943, 1944, 1966 and 1989 respectively. In particular, a technology related to separated oscillatory fields (SOFs) invented by the American scientist Ramsey has solved the problems of uniformity of a static magnetic field and wavelength limitation of a microwave field in an atomic beam magnetic resonance device, and has become an excellent means for obtaining quantum transition signals with a narrower linewidth and a higher signal-to-noise ratio. Nowadays, Ramsey' method of atomic beam magnetic resonance have been widely used in the construction of atomic clocks and mass spectrometers and the measurement of basic physical constants, and have become the most widely used atomic beam magnetic resonance methods in the world. Therefore, it is of great scientific significance and application value to explore a novel method to generate an atomic beam magnetic resonance spectrum.

Ramsey' method of atomic beam magnetic resonance known to the public all adopt a single cavity to provide two coherently SOFs, and make an atomic beam interacting with the two SOFs. As a result, the obtained Ramsey magnetic resonance spectrum under the single cavity excitation involves Rabi background, which often causes a shift of atomic transition frequency. Moreover, it is difficult to suppress some technical noises (such as electrical noise and optical noise) in such a magnetic resonance system. This leads to the limitation of signal-to-noise ratio when using a resonance system based on a single Ramsey cavity.

SUMMARY

The purpose of the disclosure is to provide an atomic beam magnetic resonance method and system based on combined SOFs, aiming at overcoming the shortcomings of the related art. The technical problems to be solved by the disclosure are realized by the following technical solutions.

In one aspect, an embodiment of the disclosure provides an atomic beam magnetic resonance method based on the combined SOFs, which includes: step 1, generating, by an atomic beam source, two identical atomic beams; step 2, performing atomic state purification treatment on the two identical atomic beams to generate two identical state-purified atomic beams; step 3, exciting, by zero-phase-difference SOFs, one of the two identical state-purified atomic beams to perform atomic beam magnetic resonance to thereby obtain a first atomic beam magnetic resonance signal; and exciting, by π-phase-difference SOFs, the other of the two identical state-purified atomic beams to perform atomic beam magnetic resonance to thereby obtain a second atomic beam magnetic resonance signal, where the zero-phase-difference SOFs and the π-phase-difference SOFs have the same interaction length, the same drift length, and the same oscillatory field strength; and step 4, performing subtraction operation on the first atomic beam magnetic resonance signal and the second atomic beam magnetic resonance signal to thereby generate a combined Ramsey magnetic resonance signal.

In an illustrated embodiment, the two identical atomic beams are disposed in the same static magnetic field environment and have the same quantization axis.

In an illustrated embodiment, a method for the atomic state purification treatment is an optical method or a gradient magnetic field state selection method.

In an illustrated embodiment, a Ramsey transition probability function describing the combined Ramsey magnetic resonance signal is expressed as:

$$P_c = \int_0^\infty f(\tau)\sin^2(b\tau)\cos(\Delta T)d\tau,$$

where $\tau$ represents a duration of interaction between an atom and an oscillatory field; l represents the interaction length; $f(\tau)$ represents an interaction duration distribution function; b represents a strength of the oscillatory field; $\Delta=\omega-\omega_0$, $\omega$ represents an angular frequency of the oscillatory field, and $\omega_0$ represents an atomic transition angular frequency; and T represents a free drift duration of the atom in an oscillatory field-free region of a length L.

In another aspect, an embodiment of the disclosure provides an atomic magnetic resonance system based on a combined SOFs, which includes an atomic beam source, an atomic state purification device, a static magnetic field generation device, a zero-phase-difference Ramsey cavity, π-phase-difference Ramsey cavity, an atomic state detection device, and a subtractor. The atomic beam source is configured to generate two identical atomic beams, the atomic state purification device is configured to perform atomic state purification treatment on the two identical atomic beams to generate two identical state-purified atomic beams, and the static magnetic field generation device is configured to provide a quantization axis. The zero-phase-difference Ramsey cavity is configured to excite one of the two identical state-purified atomic beams to generate a first atomic beam magnetic resonance signal, and the π-phase-difference Ramsey cavity is configured to excite the other of the two identical state-purified atomic beams to generate a second atomic beam magnetic resonance signal, and the two identical atomic state detection devices are configured to extract the first atomic beam magnetic resonance signal and the second atomic beam a magnetic resonance signal, where the zero-phase-difference SOFs and the π-phase-difference SOFs have the same interaction length, the same drift length, and the same oscillatory field strength. The subtractor is configured to receive the first atomic beam magnetic resonance signal and the second atomic beam magnetic resonance signal and perform subtraction operation to generate a combined Ramsey magnetic resonance signal.

In an illustrated embodiment, the two identical atomic beams are disposed in the same static magnetic field environment and have the same quantization axis.

In an illustrated embodiment, the atomic state purification device is an optical purification device or a gradient magnetic field state selection purification device.

In an illustrated embodiment, the atomic state detection device is an optical detection device or an electron multiplier detection device, and the optical detection device includes a detection light generation device and two fluorescence collectors.

In an illustrated embodiment, a Ramsey transition probability function describing the combined Ramsey magnetic resonance signal is expressed as:

$$P_c = \int_0^\infty f(\tau)\sin^2(b\tau)\cos(\Delta T)d\tau$$

where $\tau$ represents a duration of interaction between an atom and an oscillatory field; l represents the interaction length; $f(\tau)$ represents an interaction duration distribution function; b represents a strength of the oscillatory field; $\Delta=\omega-\omega_0$, $\omega$ represents an angular frequency of the oscillatory field, and $\omega_0$ represents an atomic transition angular frequency; and T represents a free drift duration of the atom in an oscillatory field-free region of a length L.

The disclosure has at least the following beneficial effects.

According to the disclosure, zero-phase-difference SOFs and π-phase-difference SOFs are used to respectively excite two identical state-purified atomic beams in the same vacuum and static magnetic field environment, and thereby a combined Ramsey magnetic resonance spectrum without Rabi background is generated. The advantages of the combined Ramsey magnetic resonance signal are as follows: the Rabi pulling effect is significantly suppressed and thus the pulling shift of atomic frequency is reduced; an intensity of the combined Ramsey magnetic resonance signal is increased to twice that of the traditional Ramsey magnetic resonance signal; and some technical noises are eliminated by differential operation (i.e., the subtraction operation). As a result, the combined Ramsey magnetic resonance allows a more purer spectrum generation. In a word, through the atomic beam magnetic resonance method of the disclosure, a novel combined Ramsey magnetic resonance spectrum without Rabi background, with a stronger signal and a lower noise level (i.e., a higher signal-to-noise ratio) can be obtained.

The disclosure will be further described in detail with the accompanying drawings and embodiments.

DETAILED DESCRIPTION OF EMBODIMENTS

The disclosure will be described in detail hereinafter combined with specific embodiments, but implementations of the disclosure are not limited thereto.

First Embodiment

Atomic beam magnetic resonance technology under the excitation of SOFs was invented in 1950s. Since then, it attracted extensive attention in physics field, which not only became a revolutionary tool for accurately measuring physical properties of atoms, molecules and atomic nucleus, but also directly led to the practical use of atomic beam clocks. The atomic beam clocks have replaced traditional timekeeping tools (such as quartz oscillators), promoting human timing into the era of atomic time. However, the performance of the atomic beam clocks has not been significantly improved for recent decades. One of the main limiting factors is the low signal-to-noise ratio of the resonance signal generated by the existing beam magnetic resonance methods. Therefore, how to enhance the resonance and reduce the noise level has become an important problem to be solved in the field of precision spectroscopy of atoms and molecules.

Figure 1:
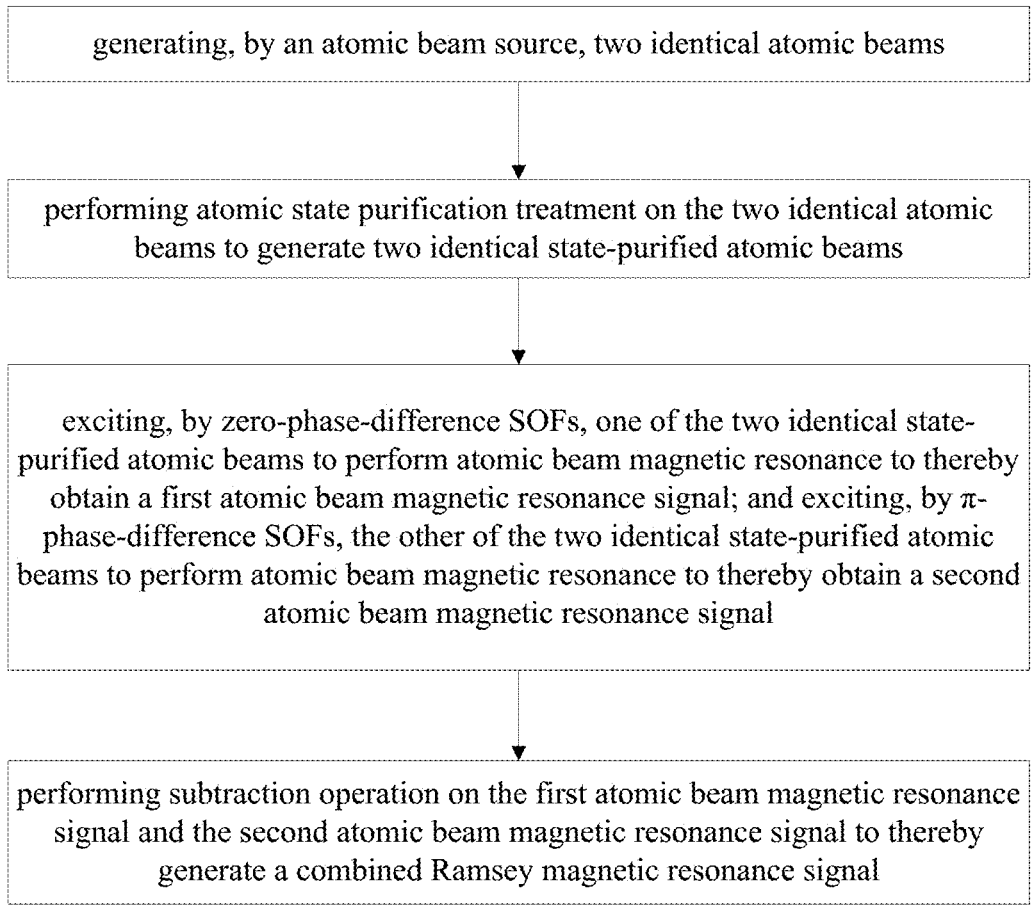
FIG. 1 illustrates a schematic flow chart of an atomic beam magnetic resonance method based on the combined SOFs according to an embodiment of the disclosure.

In order to increase a signal-to-noise ratio of a magnetic resonance signal, as illustrated in FIG. 1, an embodiment of the disclosure provides an atomic beam magnetic resonance method based on the combined SOFs, which includes:

step 1, generating, by an atomic beam source, two identical atomic beams;

step 2, performing atomic state purification treatment on the two identical atomic beams to generate two identical state-purified atomic beams;

step 3, exciting, by zero-phase-difference SOFs, one of the two identical state-purified atomic beams to perform atomic beam magnetic resonance to thereby obtain a first atomic beam magnetic resonance signal; and exciting, by π-phase-difference SOFs, the other of the two identical state-purified atomic beams to perform atomic beam magnetic resonance to thereby obtain a second atomic beam magnetic resonance signal, wherein the zero-phase-difference SOFs and the π-phase-difference SOFs have the same interaction length, the same drift length, and the same oscillatory field strength; and step 4, performing subtraction operation on the first atomic beam magnetic resonance signal and the second atomic beam magnetic resonance signal to thereby generate a combined Ramsey magnetic resonance signal.

Specifically, the Ramsey transition probability of a single-speed atomic beam (that is, all the atoms have a common speed) excited by two coherently SOFs provided by a single Ramsey cavity may be expressed as:

$$P(\tau) = \frac{4b^2}{\Omega^2}\sin^2\frac{\Omega\tau}{2}\left[\cos\frac{\Omega\tau}{2}\cos\frac{\Delta T+\phi}{2} - \frac{\Delta}{\Omega}\sin\frac{\Omega\tau}{2}\sin\frac{\Delta T+\phi}{2}\right]^2$$

where $\tau$ represents a duration of interaction between an atom and an oscillatory field; b represents a strength of the oscillatory field; $\Delta=\omega-\omega_0$, representing an angular frequency detuning, w represents an angular frequency of the oscillatory field, and $\omega_0$ represents an atomic transition angular frequency; $\Omega$ represents an atomic Rabi frequency in the given SOFs, and $\Omega = \sqrt{b^2 + \Delta^2}$; $\phi$ is a phase difference between two SOFs; T represents a free drift duration of the atom in an oscillatory field-free region of a length L.

Ramsey transition is the result of the excitation of an atomic beam by the two coherent oscillatory fields and the interference effect caused by the free evolution of atomic states in the free drift region. When $\phi=0$, the Ramsey transition probability of the single-speed atomic beam reaches a maximum value (i.e., $\sin^2(b\tau)$) at a resonance frequency, which corresponds to the "bright" atomic beam magnetic resonance phenomenon; or when $\phi=\pi$, the Ramsey transition probability of the single-speed atomic beam reaches a minimum value (i.e., 0) at the resonance frequency, which corresponds to the "dark" atomic beam magnetic resonance phenomenon. Under the excitation of the optimum oscillatory field (that is, in a situation of $b=(2n+\frac{1}{2})\pi/\tau$, where n is an integer), the Ramsey transition probability under the excitation of zero-phase-difference SOFs reaches a maximum of 1 at the resonance frequency. The spectrum widths (full width at half maximum) of "bright" resonance and "dark" resonance are given by $\pi/T$.

For the atomic beam magnetic resonance method based on the combined SOFs in the disclosure, the two identical atomic beams are respectively excited by two groups of SOFs with different phase differences, i.e., the SOFs with zero-phase difference (i.e., $\phi=0$) and the SOFs with $\pi$-phase difference (i.e., $\phi=\pi$), to generate a "bright" atomic beam magnetic resonance signal (i.e., the first atomic beam magnetic resonance signal) and a "dark" atomic beam magnetic resonance signal (i.e., the second atomic beam magnetic resonance signal); and subtraction operation is performed on "bright" atomic beam magnetic resonance signal and the "dark" atomic beam magnetic resonance signal to generate the combined Ramsey magnetic resonance signal.

Specifically, in the disclosure, the two identical atomic beams are generated by one atomic beam source, and then the atomic state purification treatment is performed on the two identical atomic beams to generate the two identical state-purified atomic beams. The purpose of the atomic state purification treatment is to create population inversion, so that the atomic beam magnetic resonance phenomenon can be observed experimentally.

After the two identical state-purified atomic beams are obtained, one of the two identical state-purified atomic beams is subjected to $\phi=0$ SOFs, thereby generating the "bright" atomic beam magnetic resonance signal; and the other of the two identical state-purified atomic beams is subjected to $\phi=\pi$ SOFs, thereby generating "dark" atomic beam magnetic resonance signal. In the disclosure, the $\phi=0$ SOFs and the $\phi=\pi$ SOFs are selected based on the following consideration: the "bright" Ramsey resonance has the largest atomic transition probability at the resonance frequency; and the "dark" Ramsey resonance has the smallest atomic transition probability at the resonance frequency. Both resonance spectrums can achieve identification of the atomic transition frequency. In the disclosure, the $\phi=0$ SOFs and the $\phi=\pi$ SOFs are set to have the same length of interaction region (i.e., interaction length), the same length of free drift region, and the same oscillatory field strength, except for the different phase differences. Accordingly, the combined Ramsey magnetic resonance spectrum of the disclosure may be described by a probability relation $P_c(\tau)=P(\tau)|_{\phi=0}-P(\tau)|_{\phi=\pi}$:

$$P_c(\tau) = \frac{4b^2}{\Omega^2}\sin^2\frac{\Omega\tau}{2}\left\{\left[\cos\frac{\Omega\tau}{2}\cos\frac{\Delta T}{2} - \frac{\Delta}{\Omega}\sin\frac{\Omega\tau}{2}\sin\frac{\Delta T}{2}\right]^2 - \left[\cos\frac{\Omega\tau}{2}\sin\frac{\Delta T}{2} + \frac{\Delta}{\Omega}\sin\frac{\Omega\tau}{2}\cos\frac{\Delta T}{2}\right]^2\right\}.$$

An atomic beam magnetic resonance system often operates in the near-detuning case $\Delta<<b$, and in order to obtain a narrower linewidth, the length l (i.e., interaction length) of the oscillatory field region is much smaller than the length L of the drift region, thus, $\tau<<T$ the probability relation is expressed as follows:

$$P_c(\tau) \approx \sin^2(b\tau)\cos(\Delta T).$$

It is worth noting that in the atomic beam magnetic resonance method based on the combined SOFs of the disclosure, $P_c(\tau)$ for indicating the combined Ramsey magnetic resonance spectrum is not the atomic transition probability in the traditional sense, but a symbol of a mathematical operation function carrying transition probability information. Further analysis shows that the intensity of the combined Ramsey magnetic resonance signal excited by the double Ramsey cavities is twice that of the existing Ramsey magnetic resonance signal excited by the single Ramsey cavity without increasing the spectral linewidth.

Because the Rabi background superimposed on the Ramsey magnetic resonance spectrum is insensitive to the phase difference $\phi$ between the two oscillatory fields, it means that the "bright" atomic beam magnetic resonance signal and the "dark" atomic beam magnetic resonance signal have the same Rabi background under the same $b\tau$. Therefore, the combined Ramsey magnetic resonance spectrum generated by adopting the method of the disclosure demonstrates the characteristic of Rabi background-free, so that the combined Ramsey magnetic resonance spectrum can more exactly reflect the atomic transition frequency detuning. In addition, the common-mode noises is also reduced by the differential processing of two magnetic resonance signals in the combined Ramsey magnetic resonance. To sum up, the atomic beam magnetic resonance method based on the combined SOFs is beneficial to eliminating Rabi background, enhancing the Ramsey magnetic resonance signal and reducing the common-mode technical noises, which shows that the method has the advantages of reducing frequency shift and increasing the signal-to-noise ratio of the resonance signal.

In a practical work, the speed of the atomic beam is not constant, but has a certain velocity distribution. The combined Ramsey beam magnetic resonance spectrum is then described by $$P_c = \int_0^\infty f(\tau)P_c(\tau)d\tau,$$

where $f(\tau)$ is the interaction duration distribution function. In a typical operation situation of near detuning, the probability function may be approximately expressed as follows:

$$P_c = \int_0^\infty f(\tau)\sin^2(b\tau)\cos(\Delta T)d\tau.$$

In an illustrated embodiment, a method for the atomic state purification treatment may be an optical method or a gradient magnetic field state selection method. The optical method refers to the preparation of atomic energy states by optical pumping method, so that the atoms are populated to one of the ground states as much as possible, to thereby achieve the purpose of atomic state purification. The gradient magnetic field state selection method is to force "useless" atoms to deflect, and only "useful" atoms enter the corresponding oscillatory field, so as to achieve the purpose of atomic state purification.

It should be emphasized that the method for the atomic purification treatment may also be other methods, which will not be repeated herein.

In an illustrated embodiment, the two identical atomic beams are disposed in the same static magnetic field environment and have the same quantization axis. Because atomic transition is very sensitive to the intensity and the direction of the applied static magnetic field, the same static magnetic field environment generated by a static magnetic field generation device and the same quantization axis can ensure that the "bright" atomic beam magnetic resonance and the "dark" atomic beam magnetic resonance have the same static magnetic field related effect, and the unwanted influence of the static magnetic field on the combined Ramsey magnetic resonance signal can be finally eliminated.

In an illustrated embodiment, a detection method for the combined Ramsey magnetic resonance signals may be an optical detection method, an electron multiplier detection method, or another applicable method.

In an illustrated embodiment, the atomic beams may be either hot atomic beams or cold atomic beams, or it can be atoms, molecules or charged particles in other forms, such as a cold atomic cloud, ammonia molecules, or aluminum ions.

In an illustrated embodiment, the combined Ramsey magnetic resonance signal may be obtained by subtracting the "dark" atomic beam magnetic resonance signal from the "bright" atomic beam magnetic resonance signal, or the combined Ramsey magnetic resonance signal may be obtained by subtracting the "bright" atomic beam magnetic resonance signal from the "dark" atomic beam magnetic resonance signal.

In addition, it should be emphasized that the key physical parameters such as the length of interaction region, the length of free drift region and the oscillatory field intensity for exciting atomic transition of the $\phi=0$ Ramsey cavity and the $\phi=\pi$ Ramsey cavity may not be strictly equal in an actual system based on the idea of the disclosure. In such a situation, the similar combined Ramsey resonance signal of the disclosure can be obtained by fine-tuning the parameters according to the actual system.

Rabi background exists in a traditional Ramsey magnetic resonance spectrum of atomic beam obtained under the excitation of the one group of SOFs, which will cause the change of atomic frequency; in addition, there are many technical noises in the magnetic resonance spectrum, such as electrical noise and optical noise, which will lead to the reduction of signal-to-noise ratio of the magnetic resonance signal. For the atomic beam magnetic resonance method based on combined SOFs of the disclosure, the two identical state-purified atomic beams are excited in the same vacuum and static magnetic field environment by respectively using the zero-phase-difference SOFs and the π-phase-difference SOFs, and thereby an atomic beam magnetic resonance signal without Rabi background, namely the combined Ramsey magnetic resonance signal, is generated. The advantages of the combined Ramsey magnetic resonance are as follows: the Rabi pulling effect is significantly suppressed and thus the pulling shift of atomic frequency is reduced; the intensity of the combined Ramsey magnetic resonance signal is increased to twice that of the traditional Ramsey magnetic resonance signal; and some technical noises are eliminated by differential operation (i.e., the subtraction operation). As a result, the combined Ramsey magnetic resonance allows a more purer spectrum generation.

In a word, through the atomic beam magnetic resonance method of the disclosure, a novel combined Ramsey magnetic resonance spectrum without Rabi background, with a stronger signal and a lower noise level (i.e., a higher signal-to-noise ratio) can be obtained.

Second Embodiment

Figure 2:
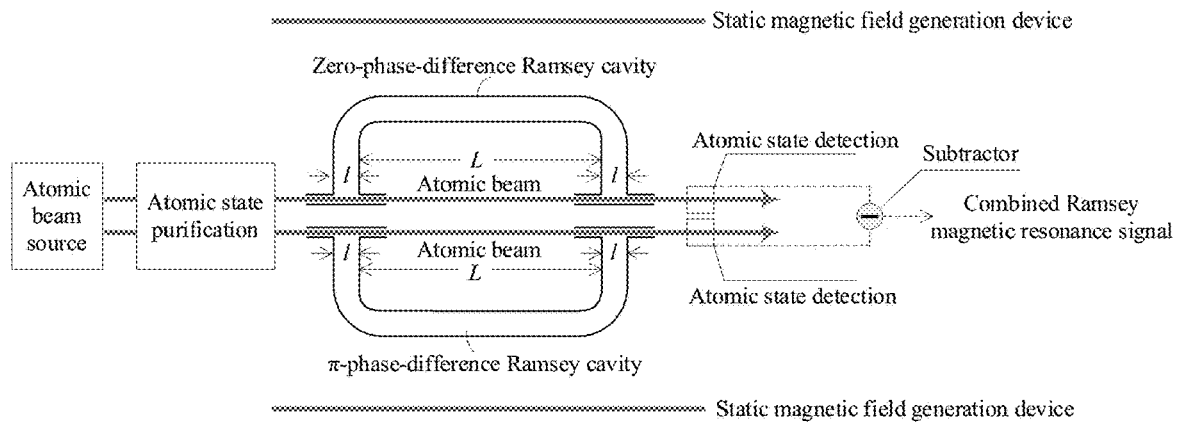
FIG. 2 illustrates a schematic structural view of an atomic beam magnetic resonance system based on the combined SOFs according to an embodiment of the disclosure.

On the basis of the first embodiment, the second embodiment of the disclosure also provides an atomic magnetic resonance system based on the combined SOFs. As illustrated in FIG. 2, the atomic magnetic resonance system based on the combined SOFs includes an atomic beam source, an atomic state purification device, a static magnetic field generation device, a zero-phase-difference Ramsey cavity, a π-phase-difference Ramsey cavity, an atomic state detection device, and a subtractor.

Specifically, the atomic beam source is configured to generate two identical atomic beams, the atomic state purification device is configured to perform atomic state purification treatment on the two identical atomic beams to generate two identical state-purified atomic beams, and the static magnetic field generation device is configured to provide a quantization axis.

Specifically, the zero-phase-difference Ramsey cavity is configured to excite one of the two identical state-purified atomic beams to generate a first atomic beam magnetic resonance signal, and the π-phase-difference Ramsey cavity is configured to excite the other of the two identical state-purified atomic beams to generate a second atomic beam magnetic resonance signal, and the two identical atomic state detection devices are configured to extract the first atomic beam magnetic resonance signal and the second atomic beam a magnetic resonance signal, where the zero-phase-difference SOFs and the π-phase-difference SOFs have the same interaction length, the same drift length, and the same oscillatory field strength.

Specifically, the subtractor is configured to receive the first atomic beam magnetic resonance signal and the second atomic beam magnetic resonance signal and perform subtraction operation on the first atomic beam magnetic resonance signal and the second atomic beam magnetic resonance signal to thereby generate a combined Ramsey magnetic resonance signal.

In an illustrated embodiment, the two identical atomic beams are disposed in the same static magnetic field environment and have the same quantization axis.

In an illustrated embodiment, the atomic state purification device may be an optical purification device or a gradient magnetic field state selection purification device. The optical purification device is configured to provide pumping light for performing atomic state purification treatment on the atomic beams, and the gradient magnetic field state selection purification device is configured to provide gradient magnetic field for performing atomic state selection.

In an illustrated embodiment, the atomic state detection device may be an optical detection device or an electron multiplier detection device, and the optical detection device includes a detection light generation device and two fluorescence collectors.

Specifically, when the atomic state purification device is the optical purification device, the atomic state detection device may be the optical detection device or the electron multiplier detection device; or when the atomic state purification device is the gradient magnetic field state selection purification device, the atomic state detection device may be the optical detection device or the electron multiplier detection device.

Specifically, when the optical purification device and the optical detection device are selected, the static magnetic field should cover the SOFs region, the pumping region, and the detection region; or when the gradient magnetic field state selection purification device and the electron multiplier detection device are selected, the static magnetic field should cover the SOFs region only.

For the atomic beam magnetic resonance method based on combined SOFs of the disclosure, the two identical state-purified atomic beams are excited in the same vacuum and static magnetic field environment by respectively using the zero-phase-difference SOFs and the π-phase-difference SOFs, and thereby an atomic beam magnetic resonance signal without Rabi background, namely the combined Ramsey magnetic resonance signal, is generated. The advantages of the combined Ramsey magnetic resonance are as follows: the Rabi pulling effect is significantly suppressed and thus the pulling shift of atomic frequency is reduced; the intensity of the combined Ramsey magnetic resonance signal is increased to twice that of the traditional Ramsey magnetic resonance signal; and some technical noises are eliminated by differential operation (i.e., the subtraction operation). As a result, the combined Ramsey magnetic resonance allows a more purer spectrum generation. In a word, through the atomic beam magnetic resonance method of the disclosure, a novel combined Ramsey magnetic resonance spectrum without Rabi background, with a stronger signal and a lower noise level (i.e., a higher signal-to-noise ratio) can be obtained.

It should be noted that, the atomic beam source, the atomic state purification device (the optical purification device or the gradient magnetic field state selection purification device), the static magnetic field generation device, the zero-phase-difference Ramsey cavity, the π-phase-difference Ramsey cavity, the atomic state detection device (the optical detection device or the electron multiplier detection device), and the subtractor described above are common devices in the skilled in the art, specific structures thereof are not limited in the disclosure as long as the corresponding functions are achieved.

Third Embodiment

Figure 3:
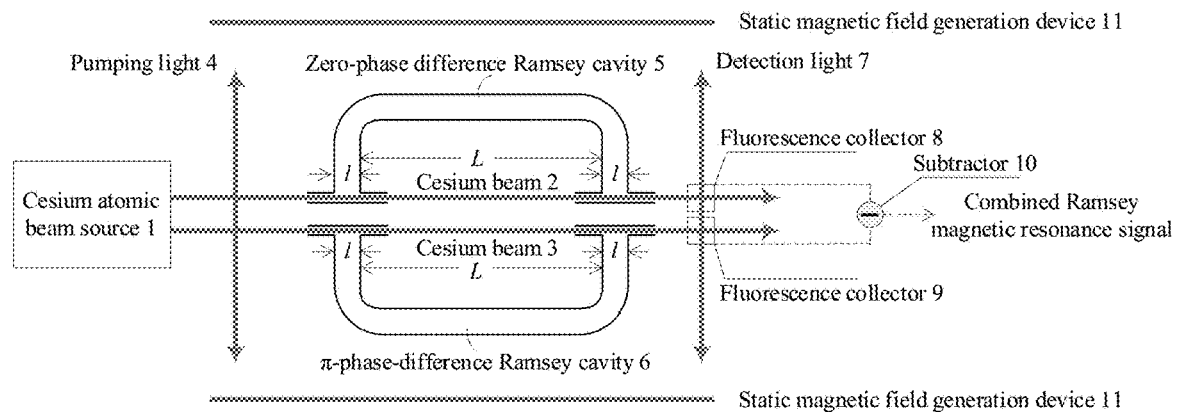
FIG. 3 illustrates a schematic structural view of a specific atomic beam magnetic resonance system based on the combined SOFs according to an embodiment of the disclosure.

On the basis of the second embodiment, the third embodiment of the disclosure also provides a specific atomic magnetic resonance system based on the combined SOFs. As illustrated in FIG. 3, the third embodiment takes a optically pumped cesium atomic beam magnetic resonance system based on the combined SOFs as an example to illustrate the atomic beam magnetic resonance method based on the combined SOFs.

In the specific atomic magnetic resonance system, a cesium atomic beam source 1 heated to a temperature of 100° C. emits two identical cesium atomic beams, namely a cesium atomic beam 2 and a cesium atomic beam 3. The most probable velocity of each beam is α~215 m/s (α= $\sqrt{2k_B T/M}$ is the most probable velocity of atoms in thermal equilibrium, $k_B$ represents the Boltzmann constant, T represents an absolute temperature of the cesium atomic beam, and M represents cesium atomic mass), and ~ represents approximation. In the third embodiment, atomic states are prepared to the required energy state by laser, to increase the number of atoms involved in magnetic resonance interaction. Specifically, under the preparation of a pumping light 4 of 852 nanometers (nm) cesium D2 line: 4↔4', the population inversion of ground state F=4→F=3 of both beam is realized, that is, the cesium atom state purification treatment is completed. The two identical F=3 cesium atomic beams prepared by the same pumping light 4 are in the same static magnetic field environment generated by the static magnetic field generation device 11 and have the same quantization axis.

The cesium atomic beam 2 after state purification enters a zero-phase-difference Ramsey cavity 5 with a resonance frequency~9.192 GHZ, and the zero-phase-difference Ramsey cavity 5 provides two spatially separated coherent oscillatory fields with phase difference φ=0, and the intensity of each of the two oscillatory fields is b, the length of an oscillatory field region of each of the two oscillatory fields is l~1 cm, and the length of a free drift region of each of the two oscillatory fields is L~21.5 cm. Excited by the φ=0 Ramsey cavity 5, the |3, 0⟩ state atoms in the cesium beam 2 undergo to the "bright" Ramsey magnetic resonance. Similarly, The cesium atomic beam 3 after state purification enters a π-phase-difference Ramsey cavity 6 with a resonance frequency~9.192 GHZ, and the π-phase-difference Ramsey cavity 6 provides two spatially separated coherent oscillatory fields with phase difference φ=π, and the intensity of each of the two oscillatory fields is b, the length of an oscillatory field region of each of the two oscillatory fields is l~1 cm, and the length of a free drift region of each of the two oscillatory fields is L~21.5 cm. Excited by the π-phase-difference Ramsey cavity 6, the |3, 0⟩ state atoms in the cesium beam 3 undergo to the "dark" Ramsey magnetic resonance.

The cesium beams 2 and 3 leaving the two Ramsey cavities 5 and 6 continue to move forward, and under the excitation of the same detection light 7 of 852 nm cesium D2 line: 4↔5', fluorescence photons carrying resonance information between the atoms and the oscillatory fields are released, which are collected by the fluorescence collector 8 and the fluorescence collector 9 respectively, as such, the "bright" atomic beam magnetic resonance signal under the excitation of the φ=0 SOFs and the "dark" atomic beam magnetic resonance signal under the excitation of the φ=π SOFs are obtained. Considering the Maxwell velocity distribution of a hot cesium atomic beam, the interaction duration distribution function $f(\tau)$ is expressed as follows:

$$f(\tau) = \frac{4}{\sqrt{\pi}} \frac{\tau_0^3}{\tau^4} \exp(-\tau_0^2/\tau^2),$$

where $\tau_0 = l/\alpha$. Ramsey transition probabilities describing the "bright" and "dark" atomic beam magnetic resonance signals under near detuning are respectively expressed as follows:

$$P|_{\phi=0} = \frac{1}{2} \int_0^\infty f(\tau) \sin^2(b\tau)[1 + \cos(\Delta T)] d\tau;$$

-continued
$$P|_{\phi=\pi} = \frac{1}{2}\int_0^\infty f(\tau)\sin^2(b\tau)[1-\cos(\Delta T)]d\tau.$$

Figure 4A:
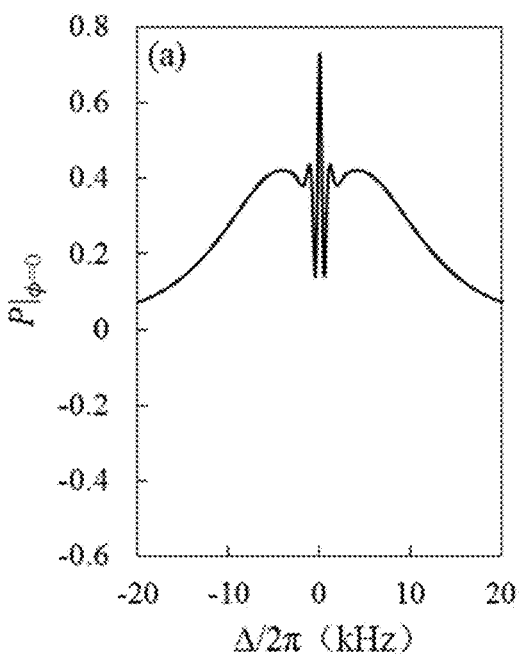
FIG. 4A through FIG. 4C illustrate schematic diagrams of cesium atomic beam magnetic resonance spectrums under single-cavity excitation and under combined-cavity excitation according to an embodiment of the disclosure.
Figure 4B:
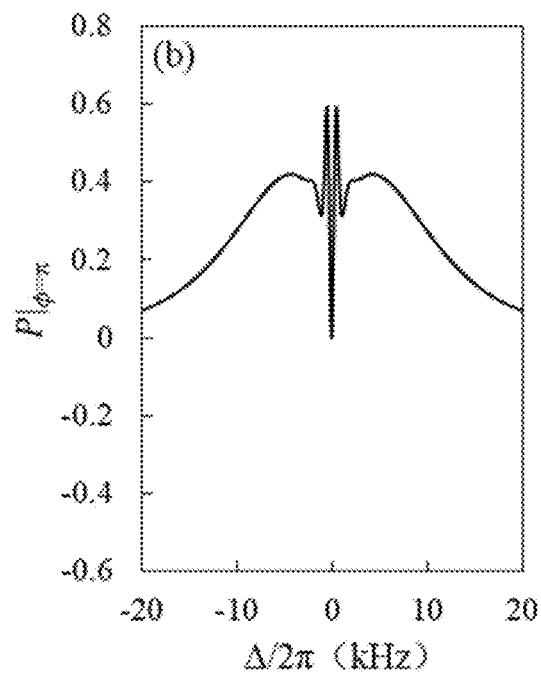
Figure 4C:
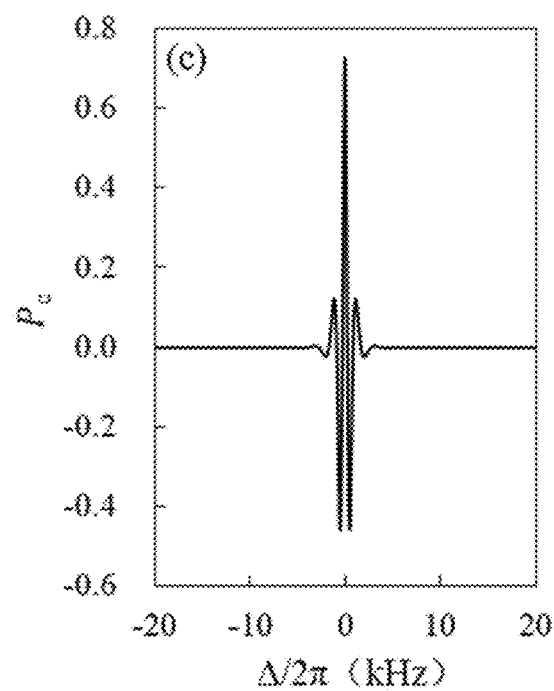

As illustrated in FIG. 4A and FIG. 4B, FIG. 4A illustrates a cesium atomic beam magnetic resonance spectrum under the optimal excitation of the ϕ=0 SOFs, which corresponds to the "bright" Ramsey magnetic resonance spectrum, and FIG. 4B illustrates a cesium atomic beam magnetic resonance spectrum under the optimal excitation of the ϕ=T SOFs, which corresponds to the "dark" Ramsey magnetic resonance spectrum. The difference is that the "bright" Ramsey magnetic resonance spectrum attains a maximum at the resonance frequency, while the "dark" Ramsey magnetic resonance spectrum attains a minimum at the resonance frequency. Both magnetic resonance spectral lines (i.e., the "bright" Ramsey magnetic resonance spectrum and the "dark" Ramsey magnetic resonance spectrum) can identify the atomic transition frequency and have the same Rabi background spectrum. The "bright" atomic beam magnetic resonance signal and the "dark" atomic beam magnetic resonance signal collected by the fluorescence collector 8 and the fluorescence collector 9 respectively are fed into a subtractor 10 for differential operation (i.e., subtraction operation), as such, a Rabi background-free combined Ramsey magnetic resonance spectrum based on the method of the disclosure is obtained, and a line shape of the combined Ramsey magnetic resonance spectrum is illustrated in FIG. 4C. The characteristic of Rabi background-free cesium combined Ramsey magnetic resonance spectrum is described by the following probability function:

$$P_c = \int_0^\infty f(\tau)\sin^2(b\tau)\cos(\Delta T)d\tau.$$

Apparently, compared with the existing atomic beam magnetic resonance method using a single Ramsey cavity, the combined atomic beam magnetic resonance method using double Ramsey cavities in the disclosure have the advantages of Rabi background elimination and higher signal-to-noise ratio.

In an illustrated embodiment, the zero-phase-difference Ramsey cavity 5 and the π-phase-difference Ramsey cavity 6 can be made of U-shaped rectangular waveguide with terminated ends. The each U-shaped cavity provides two spatially separated oscillatory fields, and a free drift region between the two oscillatory fields. The beam holes are opened at the ends of the cavities.

It should be noted that the "bright" atomic beam magnetic resonance of the disclosure means that the atomic transition probability attains a maximum at the resonance frequency, which is indicated by an upward peak of the central Ramsey spectrum in FIG. 4A. The "dark" atomic beam magnetic resonance of the disclosure means that the atomic transition probability attains a minimum at the resonance frequency, which is indicated by a downward peak of the central Ramsey spectrum in FIG. 4B.

In the description of the disclosure, it should be understood that the terms "first" and "second" are merely used for descriptive purposes, and cannot be understood as indicating or implying relative importance or implicitly indicating the number of indicated technical features. Therefore, the features defined as "first" and "second" may include one or more of these features explicitly or implicitly. In the description of the disclosure, "multiple" means two or more, unless otherwise specifically defined.

In the description of this specification, descriptions referring to the terms "one embodiment", "some embodiments", "examples", "specific examples" or "some examples" mean that specific features, structures, materials or characteristics described in connection with this embodiment or example are included in at least one embodiment or example of the disclosure. In this specification, the schematic expressions of the above terms are not necessarily aimed at the same embodiment or example. Moreover, the specific features, structures, materials or characteristics described may be combined in any one or more embodiments or examples in a suitable manner. In addition, those skilled in the art can combine and combine different embodiments or examples described in this specification.

The above is a further detailed description of the disclosure combined with specific embodiments, and it cannot be considered that the specific implementation of the disclosure is limited to these descriptions. For ordinary technicians in the technical field to which the disclosure belongs, several simple deductions or substitutions can be made without departing from the concept of the disclosure, all of which should be regarded as belonging to the scope of protection of the disclosure.

What is claimed is:

1. An atomic beam magnetic resonance method based on combined separated oscillatory fields (SOFs), comprising:
  step 1, generating, by an atomic beam source, two identical atomic beams;
  step 2, performing atomic state purification treatment on the two identical atomic beams to generate two identical state-purified atomic beams;
  step 3, exciting, by zero-phase-difference SOFs, one of the two identical state-purified atomic beams to perform atomic beam magnetic resonance to thereby obtain a first atomic beam magnetic resonance signal; and exciting, by π-phase-difference SOFs, the other of the two identical state-purified atomic beams to perform atomic beam magnetic resonance to thereby obtain a second atomic beam magnetic resonance signal, wherein the zero-phase-difference SOFs and the π-phase-difference SOFs have the same interaction length, the same drift length, and the same oscillatory field strength; and
  step 4, performing subtraction operation on the first atomic beam magnetic resonance signal and the second atomic beam magnetic resonance signal to thereby generate a combined Ramsey magnetic resonance signal, wherein a Ramsey transition probability function describing the combined Ramsey magnetic resonance signal is expressed as:

$$P_c = \int_0^\infty f(\tau)\sin^2(b\tau)\cos(\Delta T)d\tau$$

where τ represents a duration of interaction between an atom and an oscillatory field; l represents the interaction length; $f(\tau)$ represents an interaction duration distribution function; b represents a strength of the oscillatory field; $\Delta=\omega-\omega_0$, ω represents an angular frequency of the oscillatory field, and $\omega_0$ represents an atomic transition angular frequency; and T represents a free drift duration of the atom in an oscillatory field-free region of a length L.

2. The atomic beam magnetic resonance method based on the combined SOFs as claimed in claim 1, wherein the two identical atomic beams are disposed in the same static magnetic field environment and have the same quantization axis.

3. The atomic beam magnetic resonance method based on the combined SOFs as claimed in claim 1, wherein a method for the atomic state purification treatment is an optical method or a gradient magnetic field state selection method.

4. An atomic magnetic resonance system based on a combined SOFs, comprising: an atomic beam source, an atomic state purification device, a static magnetic field generation device, a zero-phase-difference Ramsey cavity, a π-phase-difference Ramsey cavity, an atomic state detection device, and a subtractor;
wherein the atomic beam source is configured to generate two identical atomic beams, the atomic state purification device is configured to perform atomic state purification treatment on the two identical atomic beams to generate two identical state-purified atomic beams, and the static magnetic field generation device is configured to provide a quantization axis;
wherein the zero-phase-difference Ramsey cavity is configured to excite one of the two identical state-purified atomic beams to generate a first atomic beam magnetic resonance signal, and the π-phase-difference Ramsey cavity is configured to excite the other of the two identical state-purified atomic beams to generate a second atomic beam magnetic resonance signal, and the two identical atomic state detection devices are configured to extract the first atomic beam magnetic resonance signal and the second atomic beam a magnetic resonance signal, wherein the zero-phase-difference SOFs and the π-phase-difference SOFs have the same interaction length, the same drift length, and the same oscillatory field strength;
wherein the subtractor is configured to receive the first atomic beam magnetic resonance signal and the second atomic beam magnetic resonance signal and perform subtraction operation to generate a combined Ramsey magnetic resonance signal, wherein a Ramsey transition probability function describing the combined Ramsey magnetic resonance signal is expressed as:

$$P_c = \int_0^\infty f(\tau)\sin^2(b\tau)\cos(\Delta T)d\tau$$

where $\tau$ represents a duration of interaction between an atom and an oscillatory field; l represents the interaction length; $f(\tau)$ represents an interaction duration distribution function; b represents a strength of the oscillatory field; $\Delta=\omega-\omega_0$, $\omega$ represents an angular frequency of the oscillatory field, and $\omega_0$ represents an atomic transition angular frequency; and T represents a free drift duration of the atom in an oscillatory field-free region of a length L.

5. The atomic magnetic resonance system based on the combined SOFs as claimed in claim 4, wherein the two identical atomic beams are disposed in the same static magnetic field environment and have the same quantization axis.

6. The atomic magnetic resonance system based on the combined SOFs as claimed in claim 4, wherein the atomic state purification device is an optical purification device or a gradient magnetic field state selection purification device.

7. The atomic magnetic resonance system based on the combined SOFs as claimed in claim 4, wherein the atomic state detection device is an optical detection device or an electron multiplier detection device, and the optical detection device comprises a detection light generation device and two fluorescence collectors.

* * * * *